United States Patent
Wirtz, II

(10) Patent No.: US 7,309,839 B1
(45) Date of Patent: Dec. 18, 2007

(54) STORAGE DEVICE FOR INTEGRATED CIRCUITS AND METHOD OF EMPLOYING A STORAGE DEVICE

(75) Inventor: Frank C. Wirtz, II, Corrales, NM (US)

(73) Assignee: Xilinx, Inc., San Jose, CA (US)

( * ) Notice: Subject to any disclaimer, the term of this patent is extended or adjusted under 35 U.S.C. 154(b) by 198 days.

(21) Appl. No.: 10/966,667

(22) Filed: Oct. 15, 2004

(51) Int. Cl.
*H05K 1/03* (2006.01)
(52) U.S. Cl. ..................................................... 174/255
(58) Field of Classification Search ............... 174/255; 361/784, 704, 818, 785, 752
See application file for complete search history.

(56) References Cited

U.S. PATENT DOCUMENTS

| | | | | |
|---|---|---|---|---|
| 6,128,201 A | * | 10/2000 | Brown et al. | 361/784 |
| 6,359,777 B1 | * | 3/2002 | Newman et al. | 361/683 |
| 6,866,518 B1 | * | 3/2005 | Korsunsky et al. | 439/61 |
| 6,918,775 B2 | * | 7/2005 | Korsunsky et al. | 439/65 |
| 6,968,413 B2 | * | 11/2005 | Cranford et al. | 710/300 |
| 7,010,629 B1 | * | 3/2006 | Frame et al. | 710/100 |

OTHER PUBLICATIONS

Amkor Technology; Amkor Strip Test Overview, pp. 1-2, available at http://www.amkor.com/services/test/amkorstriptest.pdf.
Amkor Technology; Amkor Strip Test Overview:, Service Sheet (SS17C), available at http://www.amkor.com/services/test/striptest.cfm.

* cited by examiner

*Primary Examiner*—Tuan T. Dinh
*Assistant Examiner*—Abiy Getachew
(74) *Attorney, Agent, or Firm*—John J. King

(57) ABSTRACT

The present invention relates generally to integrated circuit trays, and in particular, to an integrated circuit tray enabling communication with integrated circuit stored therein. A storage tray for storing integrated circuits according to one embodiment of the invention comprises a plurality of recesses adapted to receive an integrated circuit. A conductor extends between the plurality of recesses and comprises a plurality of contacts associated with the recesses. A terminal portion, such as a connector, is coupled to the conductor to enable programming the integrated circuits stored in the tray. Embodiments having additional components are also described. Further, embodiments for connecting a plurality of trays and enabling programming of integrated circuits in the plurality of trays are also described. A system for programming integrated circuits in a storage device is also described. Methods of communicating with a plurality of integrated circuits in a storage tray are also disclosed.

23 Claims, 7 Drawing Sheets

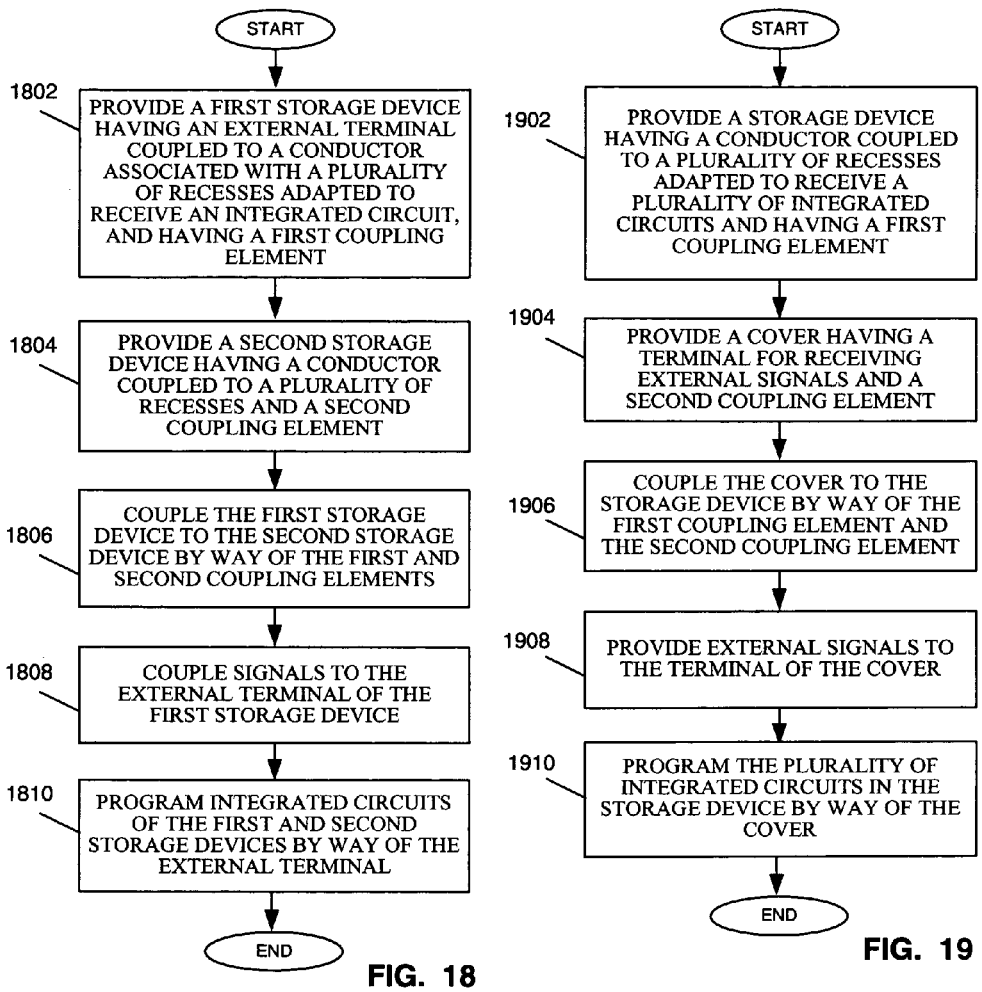

STORAGE DEVICE FOR INTEGRATED CIRCUITS AND METHOD OF EMPLOYING A STORAGE DEVICE

FIELD OF THE INVENTION

The present invention relates generally to integrated circuit storage devices, and in particular, to an integrated circuit storage device enabling communication with integrated circuits stored therein, and a method of employing a storage device for an integrated circuit.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), etc. The programmable logic implements the logic of a user design using programmable elements that can include, for example, function generators, registers, arithmetic logic, etc. The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA. Another common programmable logic device is a complex programmable logic device (CPLD). For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

However, such programmable devices require programming by the customer in order to be functional in the target operating system. Programmable devices are shipped using standard packaging methods, most commonly via a tray or tube, and therefore must be removed to be programmed. The programming steps required to configure the device can be time consuming and can add overall cost to the development project or resulting product. Some product manufacturers use contract programming services provided by integrated circuit manufacturers, integrated circuit distributors, or third party programmers. Many of these programming systems use device handlers to automatically extract a device from a tray, put the device in a socket, program the device, and then place it in a tray. However, these systems are very costly. Other contract programming vendors perform a large amount of the device handling in a manual fashion, which is also very costly in terms of labor. While these packages for shipping or storing programmable devices are typically non-conductive, static dissipative types of plastics which protect the device, they provide little other function or benefit.

Accordingly, there is a need for an improved integrated circuit storage device, such as a tray or tube for storing integrated circuits, and a method of and system for communicating with integrated circuits in a storage tray.

SUMMARY OF THE INVENTION

The present invention relates generally to integrated circuit storage devices, and in particular, to an integrated circuit storage device enabling communication with an integrated circuit stored therein. A storage device for storing integrated circuits according to one embodiment of the invention comprises a plurality of recesses adapted to receive integrated circuits. A conductor extends between the plurality of recesses and comprises a plurality of contacts associated with the recesses. A terminal portion, such as a connector, is coupled to the conductor to enable programming the integrated circuits stored in the storage device. Embodiments having additional components are also described. Further, embodiments for interconnecting a plurality of storage devices and enabling programming of integrated circuits in the plurality of storage devices are also described.

Systems for programming integrated circuits in a storage are also described. According to one embodiment, the system preferably comprises a control circuit having data signals and an input/output terminal coupled to the control circuit. The input/output terminal preferably outputs the data signals. Finally, a storage device having an input/output terminal preferably receives data signals from the input/output terminal coupled to the control circuit.

Finally, methods of communicating with a plurality of integrated circuits in a storage device are also disclosed. According to one method, steps describe providing a conductor between a plurality of regions of the storage device for receiving the plurality of integrated circuits; coupling the plurality of integrated circuits in a first storage device by way of the conductor; and coupling data signals to the plurality of integrated circuits by way of the conductor. According to other methods, a plurality of storage devices is coupled to enable programming integrated circuits.

BRIEF DESCRIPTION OF THE DRAWINGS

FIG. 18 is a flow chart showing a method of enabling communication with integrated circuits in a plurality of integrated circuit storage devices according to an embodiment of the present invention; and FIG. 19 is a flow chart showing a method of enabling communication with an integrated circuit in an integrated circuit storage device by way of a cover for the storage device according to an embodiment of the present invention.

DETAILED DESCRIPTION OF THE DRAWINGS

Figure 1:
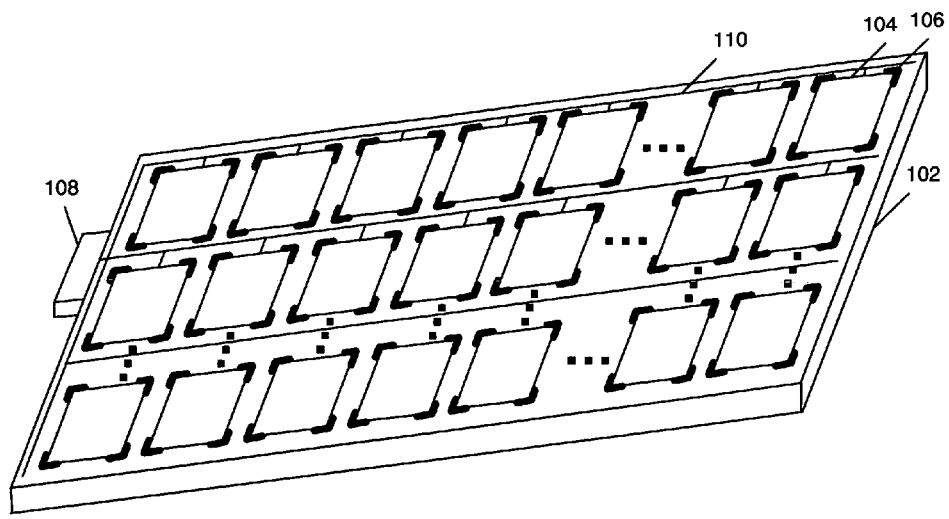
FIG. 1 is a perspective view of an integrated circuit tray according to an embodiment of the present invention.

Turning first to FIG. 1, a perspective view of an integrated circuit tray according to an embodiment of the present invention is shown. In particular, a tray 102 comprises a plurality of recesses 104 having retaining members 106 for receiving an integrated circuit. Although retaining members are shown on the corners of the integrated circuit, retaining members may be positioned at other locations according to the present invention. A terminal portion 108, such as a connector or other input/output interface, is coupled to a conductor 110 and is adapted to receive data signals. A connector may comprise a physical connector, for example, while an input/output interface may comprise a wireless interface, such as a radio frequency (RF) or infrared (Ir) transceiver. The conductor 110 may comprise a single conductor or a bus having a plurality of conductors. As will be described in more detail in reference the remaining figures, integrated circuits in recesses 104 can be programmed by way of the terminal portion 108 and conductor 110. The data transmitted between a computer and an integrated circuit stored in the tray may comprise programming data such as configuration data, test data such as test vectors, or inventory data. Although particular trays and tubes for storing and/or transporting integrated circuits are shown, the method of the present invention can be employed in any type of device used for storing an integrated circuit.

In some embodiments, the terminal portion 108 may include a JTAG interface. A JTAG interface is a standard interface that only requires four data lines (TDI, TMS, TCK, TDO). In such embodiments, conductor 110 may form a JTAG chain among the integrated circuits placed in the recesses.

Figure 2:
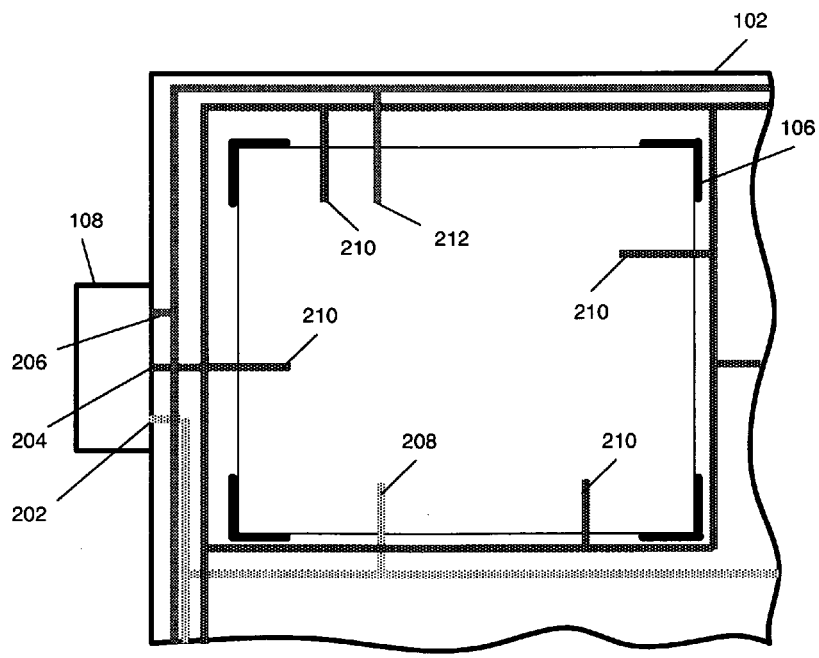
FIG. 2 is an enlarged view of an integrated circuit compartment of the tray of FIG. 1 according to an embodiment of the present invention.

Turning now to FIG. 2, an enlarged view of an integrated circuit compartment or recess of the tray of FIG. 1 according to an embodiment of the present invention is shown. In particular, a power conductor 202, a ground conductor 204, and a signal conductor 206, each of which is coupled to the terminal portion 108, extend through the tray 102. Each of the conductors preferably has at least one contact portion extending into the recess to enable the connection from the conductor to an integrated circuit in the recess. For example, power conductor 202 comprises at least one contact portion 208 extending into the recess 104. Similarly, the ground conductor 204 comprises a plurality of contact portions 210 extending into the recess 104. Finally, the signal conductor 206 comprises at least one contact portion 212 extending into the recess 104.

Although the contacts are shown extending into the recess, the contacts may extend up to the recess such that they make a connection to a corresponding contact on the integrated circuit. The dimensions of the tray are preferably designed to ensure good contact between the integrated circuits and the tray. Also, the trays preferably are designed to provide mechanical force on the pins of the integrated circuit to ensure reliable electrical contact. That is, depending on the type of integrated circuit package used, the contacts 208-210 are preferably formed on the tray to ensure an adequate electrical connection to the corresponding contacts of the integrated circuit. The conductors 202-206 can be formed by any suitable means known in the art, such as providing printed connectors formed by printing conductive ink, etching a conductive layer, attaching a laminated conductor to the tray, attaching a flex strip to the tray, attaching a wiring harness, molding the conductors into the tray, etc. The conductors may be attached to the tray by any suitable means, such as a laminate, an adhesive, acoustic welding, etc. Although a ground conductor and power conductor are shown, the tray itself may function as a ground plane or a power plane, wherein an insulator may be used on the tray to prevent any electrical contact between the non-ground pins or non-power pins and the tray. It is also possible to embed conductive elements in the tray.

Figure 3:
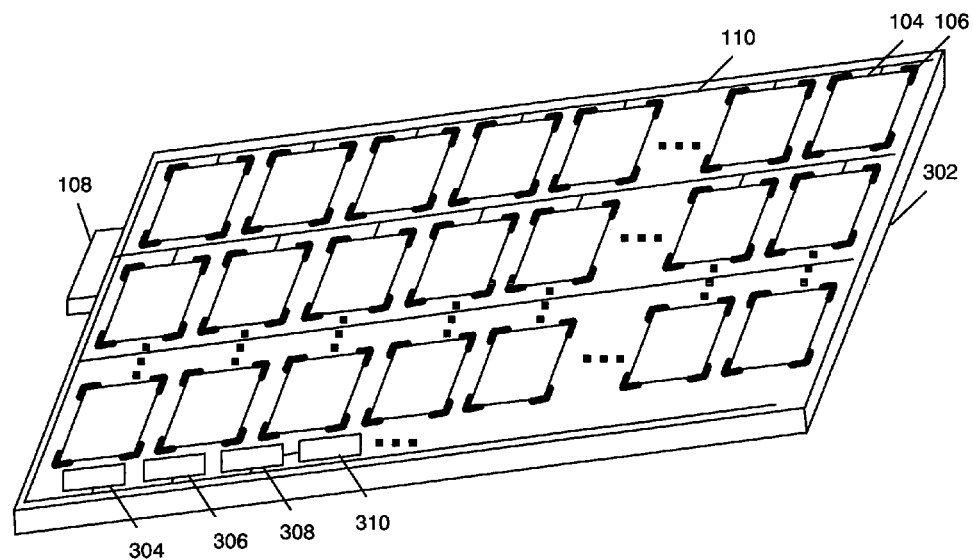
FIG. 3 is a perspective view of an integrated circuit tray according to an alternate embodiment of the present invention.

Turning now to FIG. 3, a perspective view of an integrated circuit tray according to an alternate embodiment of the present invention is shown. In particular, the tray 300 comprises one or more electronic components, other than the integrated circuits stored in the tray, which provide additional functionality for the tray. That is, the additional components, preferably stored within a plurality of receptacles for retaining the components, enable the transmission and/or storage of data to and from the tray. For example, a memory device 304 coupled to the conductor 110 may enable the storage of information, such as information related to the programming of integrated circuits stored in the tray and sent from a programming system. Examples of the systems for programming integrated circuits stored in the tray are described in more detail in reference to FIGS. 7-11. Similarly, a discrete component 306 may also be coupled to the conductor 110. The discrete component may comprise an active component, such as a microprocessor, programmable logic device, op amps, transducers, etc., or may comprise a passive component such as a capacitor or resistor to improve the electrical operation of the programming system. A sensor 308 may also be used. Some examples of sensors may include, for example, a temperature sensor, a vibration sensor, a humidity sensor, etc. Finally, a power source 310 may be included. The power source may be any type of battery or other source of power, and may be used to power any of the components and/or the integrated circuit in the tray. Any or all of the components 304-310 may also be coupled to one another and interact to send or receive information to or from the programming system. The components on the tray would preferably enable the tray to determine how many devices it contains, and how long they have been there. The inventory data stored or detected by the components may also include the revision of the chip, the manufacture date, and whether the integrated circuit has been programmed or not, and if so, the program revision. In some embodiments, one or more of the components may comprise an RFID (radio frequency identification) tag for tracking inventory or other data.

Figure 4:
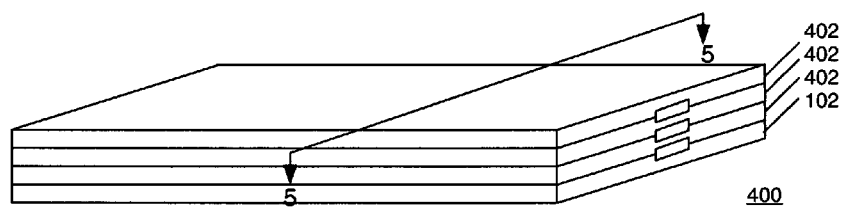
FIG. 4 is a perspective view of plurality of stacked integrated circuit trays according to an embodiment of the present invention.

Turning now to FIG. 4, a perspective view of plurality of stacked integrated circuit trays according to an embodiment of the present invention is shown. As can be seen in FIG. 4, additional trays 402 can be stacked on top of tray 102. As shown in the cross-section of FIG. 5, the plurality of trays 402 and tray 102 can communicate by way of coupling elements which are coupled to the conductor 110. In particular, an exemplary coupling element 502 comprises a receiving portion 504 and a contact portion 506, wherein the receiving portion 504 is adapted to receive a contact portion 506 when a tray 402 is coupled to another tray, such as a tray 404 or a tray 102. Each coupling element 502 is coupled to a conductor, such as conductor 102, of the tray. Accordingly, only one tray 102 having a terminal portion 108 is required to enable communication with all of the integrated circuits stored in all of the trays. However, it will be understood that a plurality of trays 102 may also be stacked according to the present invention. Similarly, a tray 302 having one or more components may also be employed in place of a tray 102 or a tray 402. Although a single coupling element is shown in the embodiment of FIG. 5, a plurality of coupling elements may be employed, such as the coupling elements shown and described in more detail in reference to FIG. 11.

Figure 5:
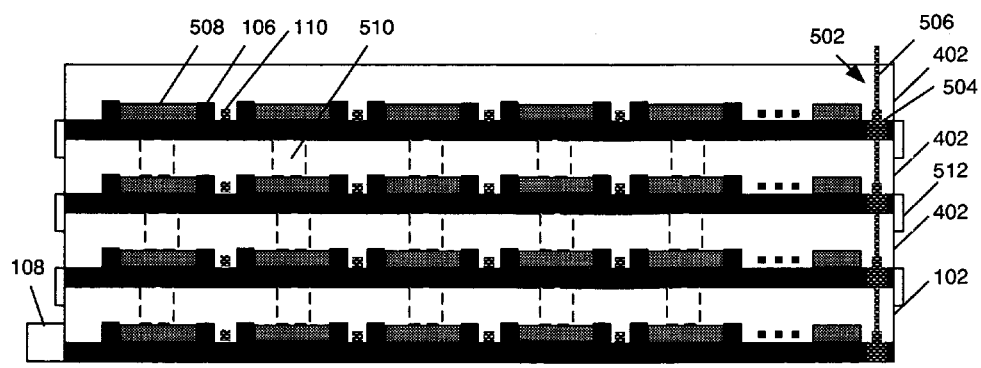
FIG. 5 is a cross-section a plurality of integrated circuit trays enabling communication with a plurality of integrated circuits according to an embodiment of the present invention.

Also shown in the cross-section of FIG. 5 is a plurality of integrated circuits 508 which are held in place by retaining members 106. Because it is desirable to maintain an adequate electrical connection between the integrated circuits and the tray, the integrated circuits may be held in place by a friction fit between the integrated circuit and the retaining members 106. Alternatively, the trays may be designed such that when the trays are stacked, additional retaining members, such as retaining member 510 shown in dashed lines, can be used to hold the integrated circuit in place to maintain an adequate electrical contact. According to the alternate embodiment, a cover having retaining members may be used for the upper most tray of the plurality of stacked trays. Similarly, latching members 512 may optionally be used to hold the trays together and maintain an adequate electrical contact between the integrated circuits and their respective trays.

By providing the tray with the capacity to electrically interconnect the integrated circuits, it is a simple matter to place all of these devices into a JTAG chain. Once in the chain and powered, the tray may be connected to a programmer that communicates to all of the devices, as described in more detail in reference to FIGS. 6-11, and then JTAG programming can occur in a normal fashion. In this way, the tray or tube, which will be described in more detail in reference to FIGS. 12-15, functions as a gang socket, as well as a protective case. The trays are also preferably reusable, such that when the integrated circuits are removed from the tray, the tray can be returned to the integrated circuit vendor to be refilled and shipped to another customer.

Figure 6:
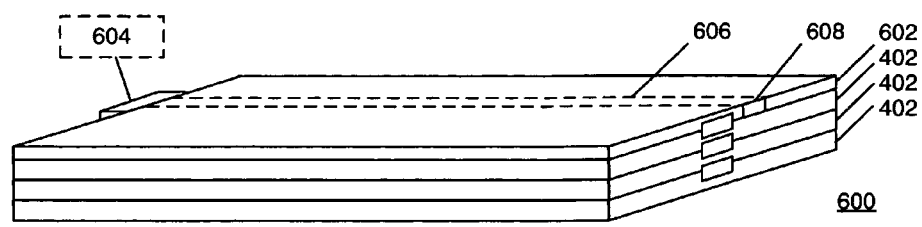
FIG. 6 is a perspective view of a plurality of stacked integrated circuit trays according to an alternate embodiment of the present invention.

Turning now to FIG. 6, a perspective view of a plurality of stacked integrated circuit trays according to an alternate embodiment of the present invention is shown. In particular, a stacked tray arrangement 600 comprises a separate cover 602 attached to a plurality of trays 402. The cover 602 comprises a terminal portion 604 which enables communication with the plurality of stacked trays by way of a conductor 606 and a coupling element 608. The cover 602 may also be a molded component and formed in the same manner and with the same components described with respect to the trays.

Figure 7:
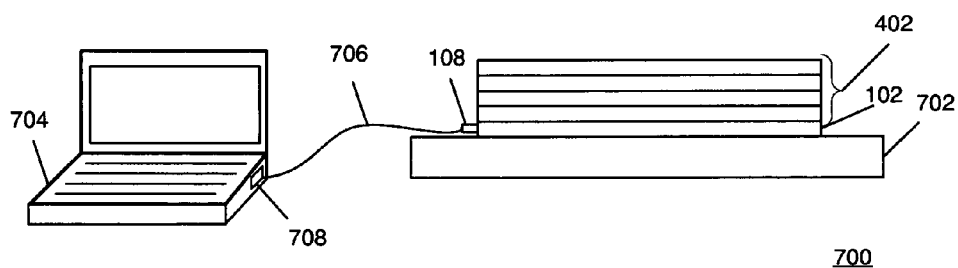
FIG. 7 is a system having a connection for communicating with a tray storing a plurality of a integrated circuits according to an embodiment of the present invention.

Turning now to FIG. 7, a system having a connection for communicating with a tray storing a plurality of a integrated circuits according to an embodiment of the present invention is shown. In particular, system 700 comprises a platform 702 for receiving a tray or plurality of stacked trays. A tray 102, in communication with a plurality of trays 402, is coupled to a computer 704 comprising a control circuit by way of a cable 706. The control circuit preferably comprises data to be transmitted to or received from the tray. That is, a cable 706 enables communication between the terminal portion 108 of the tray 102 and a terminal portion 708 of the computer 704. The cable 706 may be any suitable cable to enable communication between the computer and the plurality of stacked trays according to any suitable data protocol. The terminal portion 708 may be any suitable connector or input/output interface to interface with the cable.

Figure 8:
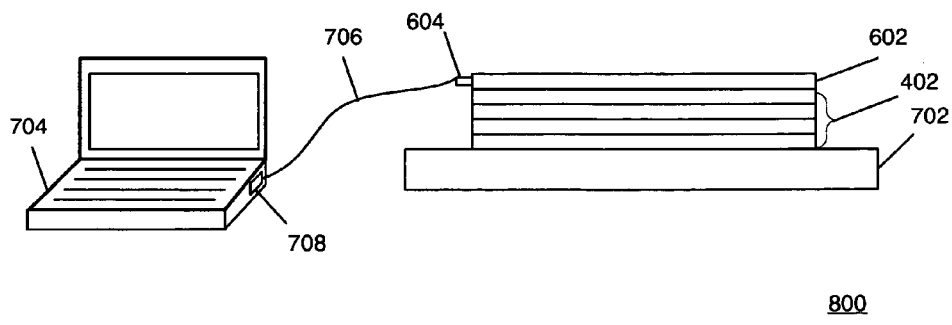
FIG. 8 is a system having a connection for communicating with a cover coupled to a tray storing a plurality of integrated circuits according to an embodiment of the present invention.

Turning now to FIG. 8, a system having a connection for communicating with a cover coupled to a tray storing a plurality of integrated circuits according to an embodiment of the present invention is shown. In particular, the embodiment of FIG. 8 shows a system employing the stacked tray arrangement 600 of FIG. 6. In particular, the terminal portion 604 of the cover 602 is coupled by way of the cable 706 to the computer 704, enabling communication in the same manner as described with respect to FIG. 7.

Figure 9:
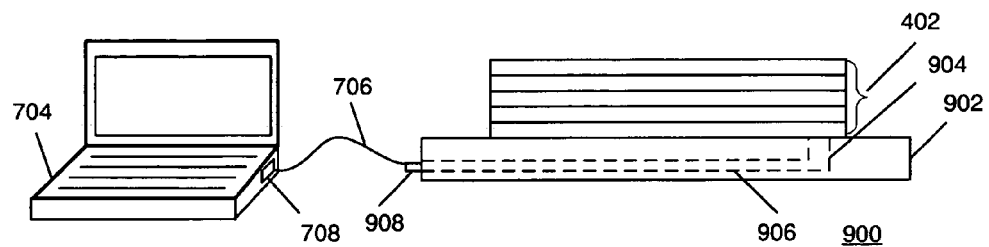
FIG. 9 is a system having a connection for communicating with a receiving platform coupled to a tray storing a plurality of integrated circuits according to an embodiment of the present invention.
Figure 10:
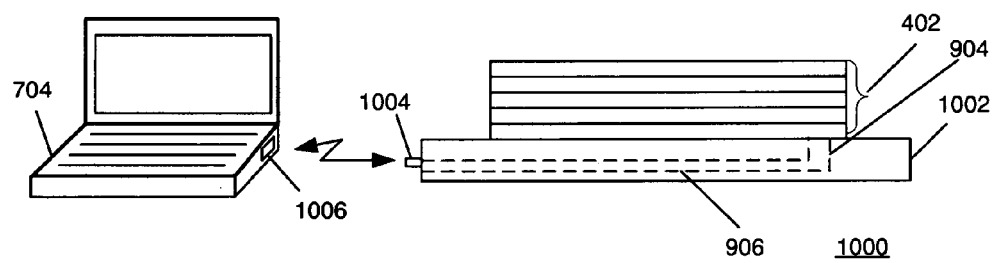
FIG. 10 is a system having a wireless connection for communicating with a receiving platform coupled to a tray storing a plurality of integrated circuits according to an embodiment of the present invention.

Turning now to FIGS. 9 and 10, systems having a connection for communicating with a receiving platform coupled to a tray storing a plurality of integrated circuits are shown. In particular, in the system 900 of FIG. 9, a plurality of stacked trays 402 are coupled to a platform 902. The platform 902 preferably comprises a coupling element 904 adapted to be coupled to a coupling element of the tray 402. The coupling element 904 enables communication between the plurality of trays 402 and the computer 704 by way of a conductor 906 and a terminal portion 908. As shown in the embodiment of FIG. 10, a system 1000 comprises a wireless connection for enabling communication between a plurality of trays 402 and a computer 704 by way of a platform 1002. In particular, the platform 1002 is coupled to a tray or plurality of trays 402 storing integrated circuits. A terminal portion 1004 comprises a wireless transceiver enabling the transmission and reception of signals between the platform 1002 and the computer 704 by way of a corresponding wireless transceiver 1006 associated with the computer 704. The wireless communication link between the computer and the platform 1002 may be any short range or long range wireless link, such as a radio frequency link, an infrared link, wireless telecommunication link, etc.

Figure 11:
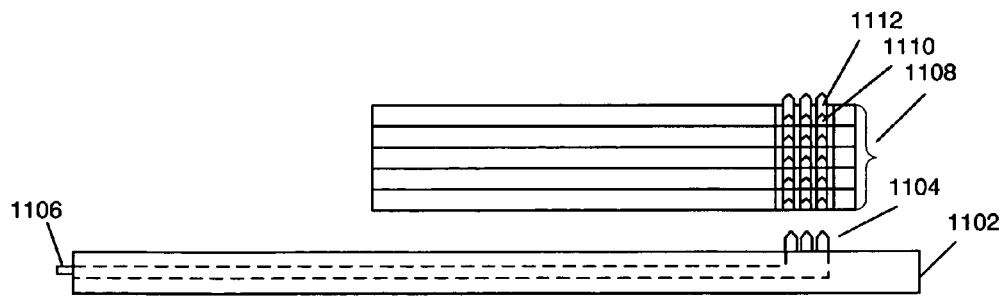
FIG. 11 is an enlarged view of a platform and a plurality of integrated circuit trays comprising connectors for enabling communication between the receiving platform and the plurality of integrated circuit trays according to an embodiment of the present invention.

Turning now to FIG. 11, an enlarged view of a platform and a plurality of integrated circuit trays comprising connectors for enabling connections between the receiving platform and the plurality of integrated circuit trays according to an embodiment of the present invention is shown. In particular, the platform 1102 comprises a connector 1104 having a plurality of contacts, such as power, ground and signal contacts as described above in detail in reference to FIG. 2. The plurality of contacts enables communication with a terminal portion 1106 and a plurality of trays 1108. Each tray also comprises a corresponding plurality of coupling elements associated with the trays, wherein each coupling element comprises a receiving portion 1110 and a contact portion 1112.

Figure 12:
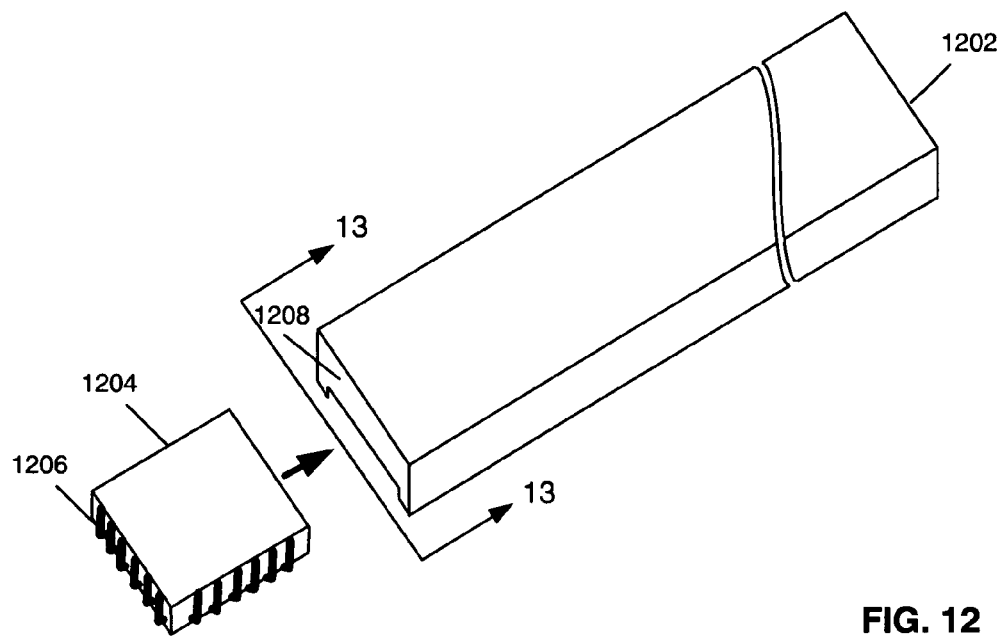
FIG. 12 is a perspective view of a storage tube according to an alternate embodiment of the present invention.
Figure 13:
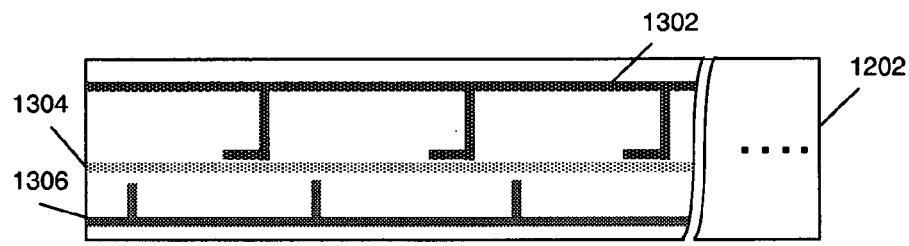
FIG. 13 is a cross-sectional view of the storage tube of FIG. 12 without integrated circuits taken at lines 13-13.
Figure 14:
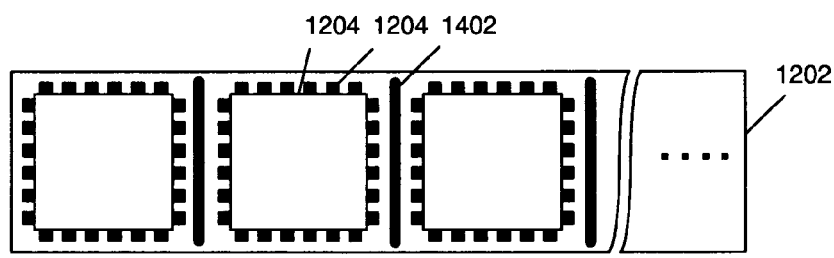
FIG. 14 is a cross-sectional view of the storage tube of FIG. 12 with integrated circuits taken at lines 13-13.

Turning now to FIG. 12, a perspective view of a storage tube according to an alternate embodiment of the present invention is shown. In particular, a storage tube 1202 receives a plurality of integrated circuits 1204, wherein each integrated circuit includes a plurality of contacts 1206. The storage tube preferably includes an opening on the end enabling the integrated circuits to be loaded into the storage tube. As shown in the cross-section of FIG. 13, a power conductor 1302, a ground conductor 1304, and a signal conductor 1306, each of which is coupled to a terminal portion, extend through the tube 1202. As will be described in reference to the system diagram of FIG. 15, the terminal portion, which may also function as a cap for the tube, has contacts coupled to the conductors of the storage tube. Each of the conductors also has at least one contact portioned to make an electrical connection to a contact of an integrated circuit in the storage tube. As shown in the cross-sectional view of the storage tube in FIG. 14, a plurality of insulators 1402 are inserted between the plurality of integrated circuits to prevent contacts of the integrated circuits from making an electrical connection. The insulators 1402 effectively form a plurality of recesses for the integrated circuits.

Figure 15:
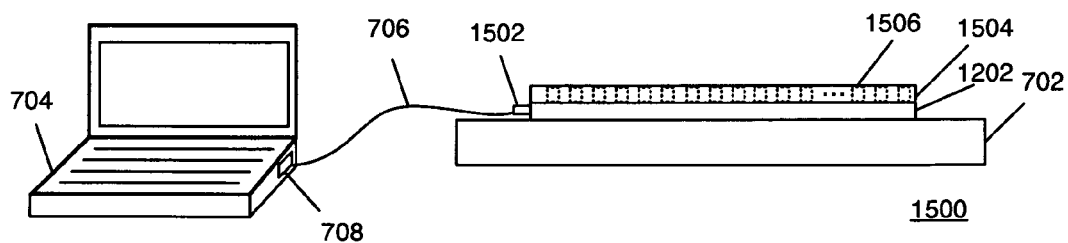
FIG. 15 is a system having a connection for communicating with a storage tube storing a plurality of integrated circuits according to an embodiment of the present invention.

Turning now to FIG. 15, a system having a connection for communicating with a storage tube storing a plurality of integrated circuits according to an embodiment of the present invention is shown. In particular, a conventional cap of the tube may be replaced with a cap 1502 which would fit into the opening of the tube and provide electrical connections to the conductors of storage tube. The system of FIG. 15 may employ the connectors between the computer 704 and the storage tube, as well as coupling elements between storage tubes, as shown for example in the embodiments of FIGS. 7-11. According to one aspect of the embodiment of FIG. 15, a cover 1504 comprises a plurality of plungers 1506 to apply a downward force on each of the integrated circuits to maintain an adequate connection between the pins of the integrated circuits and the contacts of the storage tube. However, plungers may also be employed on the storage tube itself, enabling stacking of storage tubes as shown in FIGS. 6-10.

Figure 16:
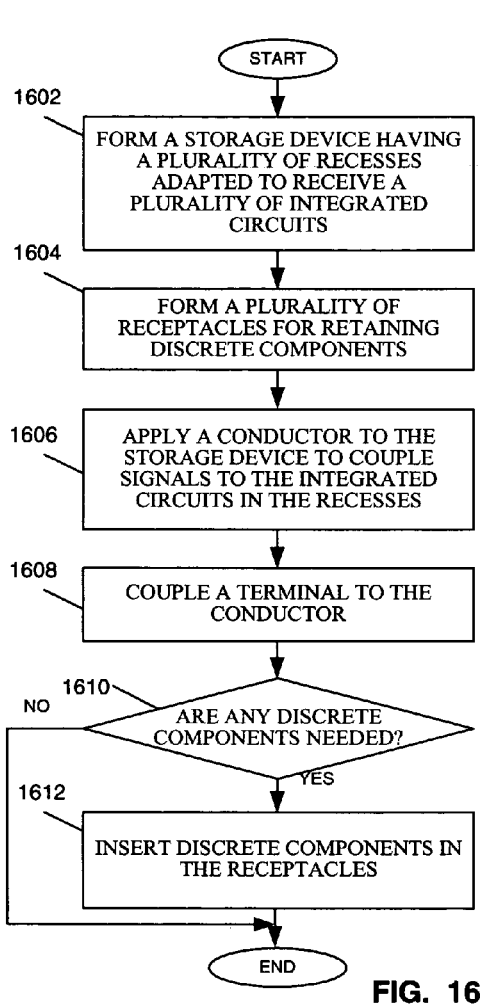
FIG. 16 is a flow chart showing a method of forming an integrated circuit storage device according to an embodiment of the present invention.

Turning now to FIG. 16, a flow chart shows a method of forming an integrated circuit storage device according to an embodiment of the present invention. The method described in FIG. 16 may be used to produce a tray or tube according to an embodiments of FIGS. 1-3 or FIGS. 12-14, for example. In particular, a storage device having a plurality of recesses adapted to receive a plurality of integrated circuits is formed at a step 1602. A plurality of receptacles for retaining discrete components is also formed at a step 1604. A conductor is then applied to the storage device to couple signals to the integrated circuits in the recesses at a step 1606. A terminal is then coupled to the conductor at a step 1608. It is then determined if there are any discrete components needed at a step 1610. If so, the discrete components are then inserted into the receptacles at a step 1612.

Figure 17:
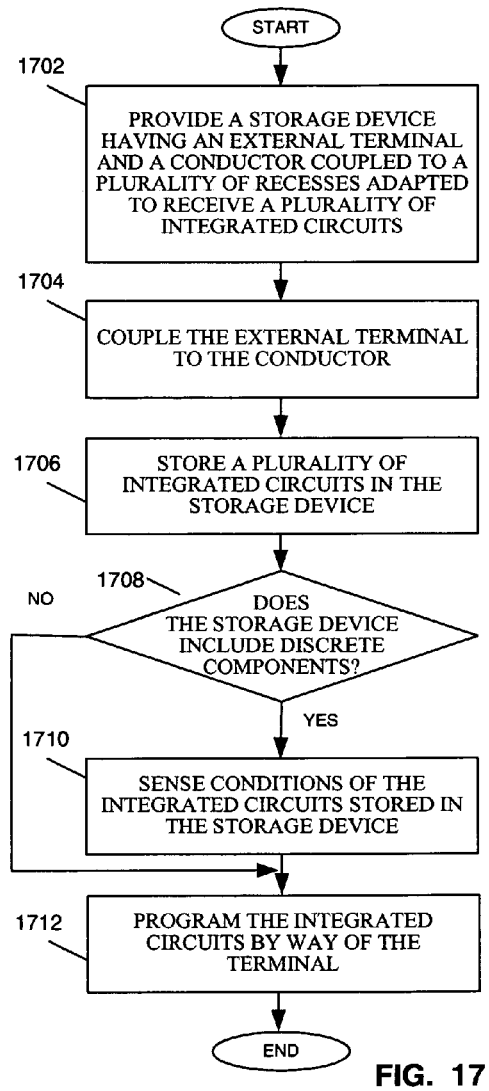
FIG. 17 is a flow chart showing a method of enabling communication with an integrated circuit in an integrated circuit storage device according to an embodiment of the present invention.

Turning now to FIG. 17, a flow chart shows a method of enabling communication with an integrated circuit in an integrated circuit storage device according to an embodiment of the present invention. A storage device having an external terminal and a conductor coupled to a plurality of recesses adapted to receive a plurality of integrated circuits is provided at a step 1702. The external terminal is coupled to the conductor at a step 1704. A plurality of integrated circuits are then stored in the storage device at a step 1706. It is then determined whether the storage device includes discrete components at a step 1708. If so, conditions of the integrated circuits stored in the storage device are detected at a step 1710. Finally, the integrated circuits are programmed by way of the terminal at a step 1712.

Turning now to FIG. 18, a flow chart shows a method of enabling communication with integrated circuits in a plurality of integrated circuit storage devices according to an embodiment of the present invention. A first storage device having an external terminal coupled to a conductor associated with a plurality of recesses adapted to receive an integrated circuit, and having a first coupling element, is provided at a step 1802. A second storage device having a conductor coupled to a plurality of recesses and a second coupling element is provided at a step 1804. The first storage device is coupled to the second storage device by way of the first and second coupling elements at a step 1806. Signals are then coupled to the external terminal of the first storage device at a step 1808. Finally, integrated circuits of the first and second storage devices are then programmed by way of the external terminal at a step 1810.

Turning now to FIG. 19, a flow chart shows a method of enabling communication with an integrated circuit in an integrated circuit storage device by way of a cover for the storage device according to an embodiment of the present invention. A storage device having a conductor coupled to a plurality of recesses adapted to receive a plurality of integrated circuits and having a first coupling element is provided at a step 1902. A cover having a terminal for receiving external signals and a second coupling element is provided at a step 1904. The cover is coupled to the storage device by way of the first coupling element and the second coupling element at a step 1906. External signals are provided to the terminal of the cover at a step 1908. Finally, the plurality of integrated circuits in the storage device is programmed by way of the cover.

It can therefore be appreciated that the new and novel storage device for storing integrated circuits and method of employing a storage device have been described. It will be appreciated by those skilled in the art that, particular to the teaching herein, numerous alternatives and equivalents will be seen to exist which incorporate the disclosed invention. For example, although programmable logic devices are described, the structures and methods of the present invention may be employed for communicating with any type of tray for storing or shipping any type of integrated circuit. As a result, the invention is not to be limited by the foregoing embodiments, but only by the following claims.

The invention claimed is:

1. A storage device for storing integrated circuits comprising:
 a plurality of recesses, each said recess storing an integrated circuit having programmable logic;
 a power conductor having a plurality of power contacts, each power contact extending to a first predetermined location of a recess of said plurality of recesses and coupled to a corresponding contact of an integrated circuit for receiving power from a power source;

a data conductor having a plurality of data contacts, each data contact extending to a second predetermined location of a recess of said plurality of recesses and coupled to a corresponding contact of an integrated circuit, said data conductor coupling configuration data to each integrated circuit having programmable logic stored in said plurality of recesses; and a terminal portion coupled to receive said configuration data for configuring said programmable logic of each integrated circuit by way of said data conductor.

2. The storage device of claim 1 wherein said power conductor and said data conductor comprise a bus having at least one power conductor, at least one ground conductor and at least one data conductor.

3. The storage device of claim 2 further comprising a plurality of around contacts coupled to said at least one ground conductor, each around contact extending to a third predetermined location of a recess of said plurality of recesses.

4. The storage device of claim 1 wherein said terminal portion comprises a connector.

5. The storage device of claim 4, wherein said connector comprises a wireless interface.

6. The storage device of claim 1 wherein said storage device comprises a ground plane.

7. The storage device of claim 1 wherein said power conductor comprises a conductor from the group consisting of:
   a molded-in conductor;
   a printed conductor;
   a laminated conductor;
   a flex strip; or
   a wiring harness.

8. The storage device of claim 1, wherein the terminal portion comprises a JTAG interface.

9. A storage device for storing integrated circuits comprising:
   a plurality of recesses, each said recess storing an integrated circuit having programmable logic;
   a power conductor having a plurality of power contacts, each power contact extending to a first predetermined location of a recess of said plurality of recesses and coupled to a corresponding contact of an integrated circuit for receiving power from a power source;
   a data conductor having a plurality of data contacts, each data contact extending to a second predetermined location of a recess of said plurality of recesses and coupled to a corresponding contact of an integrated circuit, said data conductor coupling configuration data to each integrated circuit having programmable logic in said plurality of recesses;
   a terminal portion coupled to receive said configuration data for configuring said programmable logic of each integrated circuit by way of said data conductor; and
   an electronic component coupled to said power conductor.

10. The storage device of claim 9 wherein said electronic component comprises an active discrete component coupled to said conductor.

11. The storage device of claim 9 wherein said electronic component comprises a passive discrete component coupled to said conductor.

12. The storage device of claim 9 further comprising an environmental monitor coupled to said power conductor.

13. The storage device of claim 9 further comprising a power source coupled to said power conductor.

14. A storage device arrangement storing a plurality of integrated circuits, said storage device arrangement comprising:
   a first storage device having a first plurality of recesses storing a plurality of integrated circuits having programmable logic, a power conductor having a plurality of power contacts, each power contact extending to a first predetermined location of a recess of said first plurality of recesses and coupled to a corresponding contact of an integrated circuit for receiving power from a power source, and a data conductor having a plurality of data contacts extending to a second predetermined location of said first plurality of recesses, said data conductor coupling configuration data for configuring programmable logic to each integrated circuits having programmable logic in said first plurality of recesses;
   a second storage device having a second plurality of recesses storing a plurality of integrated circuits having programmable logic, a second power conductor having a plurality of power contacts, each power contact extending to said first predetermined location of a recess of said second plurality of recesses and coupled to a corresponding contact of an integrated circuit for receiving power from a power source, and a second data conductor having a plurality of data contacts extending to said second predetermined location of said second plurality of recesses; and
   a coupling element coupling said data conductor of said first storage device to said second data conductor of said second storage device, wherein said coupling element couples said configuration data to integrated circuits having programmable logic in said second plurality of recesses of said second storage device by way of said second conductor.

15. The storage device arrangement of claim 14 wherein said first storage device comprises a terminal portion coupled to said data conductor.

16. The storage device arrangement of claim 14 further comprising a lid having a third conductor coupled to said data conductor, said lid having a terminal portion coupled to said third conductor.

17. The storage device arrangement of claim 14 further comprising a latching member to attach said first storage device to said second storage device.

18. A system for programming integrated circuits comprising:
   a control circuit having configuration data for configuring programmable logic of integrated circuits;
   a first input/output terminal coupled to said control circuit, said first input/output terminal outputting said configuration data;
   a storage device having a plurality of recesses, each recess storing an integrated circuit of a plurality of integrated circuits having programmable logic, said storage device having a second input/output terminal, said second input/output terminal receiving said configuration data from said first input/output terminal;
   a power conductor having a plurality of power contacts, each power contact extending to a first predetermined location of a recess of said plurality of recesses and coupled to a corresponding contact of said integrated circuit for receiving power from a power source;

a data conductor having a plurality of data contacts, each data contact extending to a second predetermined location of a recess of said plurality of recesses and coupled to a corresponding contact of an integrated circuit, said data conductor coupling said configuration data to each integrated circuit having programmable logic in said plurality of recesses; and a terminal portion coupled to receive said configuration data for configuring said programmable logic of each integrated circuit by way of said data conductor.

19. The system of claim 18 wherein said second input/output terminal comprises a physical connector.

20. The system of claim 18 wherein said configuration data comprises data from the group consisting of:

test data;

programming data; or inventory data.

21. The system of claim 18 wherein said storage device is a first storage device, further comprising a second storage device having a second data conductor coupled to said data conductor of said first storage device.

22. The storage device of claim 1 wherein said storage device comprises a static dissipative tray for transporting said integrated circuits.

23. The storage device of claim 1 wherein said storage device comprises a reusable tray, wherein the tray may be refilled.

* * * * *